United States Patent
Terui

[19]

[11] Patent Number: 6,126,271
[45] Date of Patent: Oct. 3, 2000

[54] METHOD FOR MANUFACTURING A LIQUID JET RECORDING HEAD HELD IN PLACE BY A VACUUM USING A SINGLE-POINT BONDER WITH A PARTICULAR TIP CONSTRUCTION AND A HEAD MANUFACTURED BY THIS METHOD

[75] Inventor: Makoto Terui, Yokohama, Japan

[73] Assignee: Canon Kabushiki Kaisha, Tokyo, Japan

[21] Appl. No.: 09/025,572

[22] Filed: Feb. 18, 1998

[30] Foreign Application Priority Data

Feb. 19, 1997 [JP] Japan .................................. 9-050925

[51] Int. Cl.[7] .................................. B41J 2/14; B41J 2/16
[52] U.S. Cl. .................................................. 347/50
[58] Field of Search ........................... 347/50, 20; 439/55, 439/32, 40, 41; 228/135, 179.1, 7, 24, 53; 29/890.1

[56] References Cited

U.S. PATENT DOCUMENTS

| | | |
|---|---|---|
| 4,313,124 | 1/1982 | Hara . |
| 4,345,262 | 8/1982 | Shirato et al. . |
| 4,459,600 | 7/1984 | Sato et al. . |
| 4,463,359 | 7/1984 | Ayata et al. . |
| 4,558,333 | 12/1985 | Sugitani et al. . |
| 4,608,577 | 8/1986 | Hori . |
| 4,635,073 | 1/1987 | Hanson . |
| 4,723,129 | 2/1988 | Endo et al. . |
| 4,740,796 | 4/1988 | Endo et al. . |
| 4,776,509 | 10/1988 | Pitts et al. . |
| 5,634,586 | 6/1997 | Kimura et al. . |

FOREIGN PATENT DOCUMENTS

| | | |
|---|---|---|
| 0 366 405 | 5/1990 | European Pat. Off. . |
| 54-56847 | 5/1979 | Japan . |
| 59-123670 | 7/1984 | Japan . |
| 59-138461 | 8/1984 | Japan . |
| 60-71260 | 4/1985 | Japan . |

*Primary Examiner*—N. Le
*Assistant Examiner*—Raquel Yvette Gordon
*Attorney, Agent, or Firm*—Fitzpatrick, Cella, Harper & Scinto

[57] ABSTRACT

A method for manufacturing a liquid jet recording head is arranged to include the step of connecting, by use of a single point bonder, TAB tapes for supplying electric power with a chip for a liquid jet recording head having, on the central part thereof, an ink supply hole and discharge energy transducing devices for discharging ink. For this method of manufacture, the inner leads of the TAB tapes are connected with the electrode pads on the chip by use of a single point bonding tool having a groove structure formed by two grooves configured to intersect vertically at the tip thereof. With the method of manufacture thus arranged, there is no need for the enhancement of adsorption to fix the chip on the chip stage of an ILB bonder. The fixation is possible with a comparatively weak adsorption in this respect. Hence there is no fear that dust particles or the like in the atmosphere are sucked and adhere to the upper surface of discharge energy transducing devices on the chip. Therefore, an appropriate and reliable electrical connection is possible in good precision, and the production yield of heads is also improved when assembled.

6 Claims, 4 Drawing Sheets

METHOD FOR MANUFACTURING A LIQUID JET RECORDING HEAD HELD IN PLACE BY A VACUUM USING A SINGLE-POINT BONDER WITH A PARTICULAR TIP CONSTRUCTION AND A HEAD MANUFACTURED BY THIS METHOD

BACKGROUND OF THE INVENTION

1. Field of the Invention

The present invention relates to a liquid jet recording head used for the execution of a liquid jet recording method or the like that performs print recording by discharging liquid from the discharge openings as droplets. The invention also relates to a method for manufacturing such head.

2. Related Background Art

In general, a liquid jet recording head which is usable for a liquid jet recording method comprises fine discharge openings (orifices) that discharge liquid (ink), discharge energy transducing devices (heat generating resistors, for example) arranged for a part of each of liquid flow paths, and a liquid supply opening for supplying liquid to the liquid flow paths. The liquid jet recording head is structured to perform print recording by applying driving signals to the discharge energy transducing devices (heat generating resistors) in accordance with image information inputted from the outside so that the discharge energy transducing devices (heat generating resistors) are allowed to generate the thermal energy, which gives an abrupt rise of temperature beyond the one that may cause nuclear boiling phenomenon of ink, and creates film boiling in it. Thus, the ink jet recording head forms bubbles in ink, and discharges ink from the discharge openings as droplets for print recording by means of the development and contraction of each of such bubbles.

As regards the structures and methods of manufacture for a liquid jet recording head of the kind, there have been known various types and methods. Using silicon wafer or other substrate a plurality of discharge energy transducing devices are arranged on the surface of such substrate to provide ink discharge energy. For each of discharge energy transducing devices, the corresponding nozzle unit (liquid flow paths) and a plurality of discharge openings are formed to discharge ink. Here, a conventionally known type is provided with an ink supply opening formed on the central part of the liquid jet recording head, which reaches the reverse side thereof in order to supply ink.

In accordance with FIGS. 6A to 6F, the description will be made of the processing steps of a liquid jet recording head of the kind. For a silicon wafer 101, $SiO_2$ layers 102 are formed as the heat accumulation layer (FIG. 6A). On the surface thereof, there are laminated discharge energy transducing devices 103, electrodes (not shown), a protection layer (SiN) 104, and an anti-cavitation film. In this way, a pattern is formed (FIG. 6B). In this respect, the discharge energy transducing elements 103 are relatively arranged for the slit type ink supply opening which is formed afterward. Then, the positive type photoresist nozzle molding material is coated. After the pattern is formed, the nozzle member 106 (which is photosensitive epoxy resin, for example) is coated. Thus, the discharge openings 107 are formed by means of photolithography (FIG. 6C). After that, from the reverse side of the wafer 101, the $SiO_2$ layer is removed by use of buffer hydrofluoric acid. Then, using resist pattern 108 a groove 109 is formed by means of anisotropic etching in order to provide the slit type ink supply opening. The anisotropic etching is suspended at the $SiO_2$ layer 102 on the surface side (FIG. 6D). Subsequently, as shown in FIG. 6E, the $SiO_2$ layer 102 is removed by use of buffer hydrofluoric acid. After that, deep ultraviolet light is irradiated onto the nozzle molding material 105 to make it soluble. Subsequently, the nozzle molding material 105 is removed. The electrode extrusions (hereinafter referred to as bumps) 111 are formed on the electrode pads, respectively. Then, the silicon wafer substrate is separated along the substrate separation line 110 which is shown in FIG. 6E, hence obtaining the substrate chip of the liquid jet recording head (FIG. 6F). Here, FIG. 6F shows a state where inner leads 115 of TAB tape, which are indicated by broken lines, are connected with bumps 111.

The liquid jet recording head produced by a method of manufacture of the kind makes it possible to form the discharge opening plate thinner for the nozzle unit. This, in turn, makes it possible to reduce the amount of discharged ink, thus obtaining the print recording in a high image quality. Also, using resin as material for the formation of discharge plate (a member to form ink flow paths) it becomes possible to apply a spin coating method to coating such material, and also, to form the discharge openings in the steps of exposure and development processes with the advantage that its processing and handling become easier.

Then, as a method for electrically assembling the chip of the liquid jet recording head whose nozzle unit and discharge openings have been formed in this way, there is the TAB assembling in which the inner leads of TAB tape are connected by means of inner lead bonding (ILB) with the bumps on the electrode pads arranged on the circumference of the chip, and then, after the inner leads and bumps are connected, each of the junctions is assembled. As compared with the wire bonding method, this TAB assembling enables a thinner assembling to suppress the height of the sealing resin and makes it lower. Also, the TAB assembling makes it easier to wipe off (or execute blading of) ink mist or the like which adheres to the surface of the discharge opening plate. Therefore, this method is easily applicable to the electrical assembling of the chip of the liquid jet recording head which is provided with the nozzle unit and discharge openings formed on it.

Then, for the ILB method for connecting the inner leads of the TAB tape with the bumps on the chip, there are, among some others, the single point bonding, and the gang bonding where a plurality of inner leads are connected with the bumps at a time. For the liquid jet recording head chip, the single point bonding method is adopted. The ILB bonder used for the single point bonding method comprises a chip stage that fixes and holds a chip like the one as shown in FIG. 6F, for example, and heats the bumps provided for the electrode pads on the chip at the same time, as well as a bonding tool to which ultrasonic waves are transmitted from the hone which is arranged above the chip stage. In this manner, the inner leads of the TAB tape are positioned with the bumps of the chip, which have been fixed and heated on the chip stage. Then, the structure is arranged so that the bonding tool is pressed to it. To the bonding tool, a load is given, while being oscillated by the application of ultrasonic waves. Hence, the TAB inner leads and the bumps are connected. Here, it is generally practiced to use a bonding tool having a cross-patterned extrusion at its tip as the one suitable for such structure, because this extrusion provides a better capability of gripping the inner leads while the ILB is being performed.

Since ultrasonic waves are used for the single point bonding of the inner leads of a TAB tape of the kind, the base film of the chip and the TAB tape should be fixed sufficiently by means of adsorption or the like. Otherwise, it is impossible to connect the bumps on the chip and the TAB inner leads appropriately. As a result, it becomes difficult to obtain its electrical connection reliably. In other words, when pulling tests are conducted after the completion of the ILB, there are often observed the modes that may indicate the lower reliability of the devices (such as a destructive mode where the bumps and inner leads are peeled off, a destructive mode where the chip silicon underneath the pads are cracked).

Here, a through hole is made on the chip of the liquid jet recording head in order to provide the ink supply opening that penetrates the central part of the chip. Therefore, it becomes impossible to obtain a sufficient area that may provide a surface large enough to fix the chip by means of appropriate adsorption. This situation hinders the provision of sufficient adsorption of the chip when the ILB is performed. Consequently, the chip may move while the ILB is being performed, often leading to the case where the modes may take place, such as peeling off the connection between the bumps and inner leads, cracking silicon underneath the pads. In this respect, if adsorption is intensified more in order to avoid the occurrence of such modes, the air in the chamber arranged for the ILB bonder is sucked through the discharge openings when the chip is adsorbed. As a result, the dust particles or the like contained in the air in such chamber may be allowed to adhere to the upper surface of discharge energy transducing devices (heat generating resistors), hence resulting in the unfavorable event that the ink discharge performance is significantly affected. In this respect, if the ILB is performed under the clean environment, such as in a clean booth or in a clean room, it may be possible to prevent the dust particles or the like from adhering to the upper surface of the discharge energy transducing devices (heat generating resistors). However, since this system inevitably needs the provision of a clean booth, a clean room, or some other facilities, as well as the control and operation thereof, a considerable amount of additional expenditures is required accordingly.

Also, it is conceivable that clamping may be adopted, instead of adsorption, for the chip fixation when the ILB is performed. However, chipping may be easily caused by clamping if the silicon substrate is used. As a result, it is not preferable to fix the silicon chip by means of clamping. Particularly, the discharge opening plate tends to be cracked or deformed when clamping the silicon chip used for the liquid jet recording head where the ink supply opening is provided for the central part thereof, because the discharge opening plate is formed by resin above such ink supply opening. Therefore, it is not preferable to perform the ILB while clamping the silicon chip to fix it.

Also, it is most common to use a bonding tool having a cross-patterned extrusion at its tip as the TAB tool for the execution of the single point bonding as described earlier. However, if the chip cannot be fixed by means of sufficient adsorption, there are observed many cases where silicon underneath the pads are broken in particular when the pulling tests are conducted for the inner leads after the completion of the ILB. It is then found that the production yield becomes unfavorable and far from satisfaction if the bonding tool, which is provided with the cross-patterned extrusion at its tip, is adopted for the ILB of the chip used for the liquid jet recording head.

SUMMARY OF THE INVENTION

The present invention is designed with a view to solving the problems still existing in the conventional art as described above. It is an object of the invention to provide a liquid jet recording head and a method for manufacturing such head. Here, the chip, which is used for the liquid jet recording head having the ink supply opening that penetrates the central part thereof, is fixed by means of adsorption good enough to avoid almost all the adhesion of dust particles or the like to the upper surface of the discharge energy transducing devices (heat generating resistors) when the ILB of the chip is performed in an ordinary room. The electrical connection is made reliable in good precision at lower costs, and further, it is made possible to enhance the pulling strength of inner leads and the yield of the product as well.

In order to achieve the object described above, a method for manufacturing a liquid jet recording head of the present invention includes the step of connecting, by use of a single point bonder, TAB tapes for supplying electric power with a chip for a liquid jet recording head having on the central part thereof an ink supply hole and discharge energy transducing devices for discharging ink. Here, the inner leads of the TAB tapes are connected with the electrode pads on the chip by use of a single point bonding tool having a groove structure formed by two grooves configured to intersect vertically at the tip thereof.

Also, for the method for manufacturing a liquid jet recording head of the present invention, it is preferable to structure so that the two grooves intersecting vertically at the tip of the single point bonding tool are arranged to be vertically and horizontally positioned, respectively, to one side of the objective inner lead in the longitudinal direction thereof or to structure so that the two grooves intersecting vertically at the tip of the single point bonding tool are arranged to be at an angle of 45°, respectively, to one side of the objective inner lead in the longitudinal direction thereof.

Then, a liquid jet recording head of the present invention comprises a chip having an ink supply hole and discharge energy transducing devices for discharging ink formed on the central part of the chip, and a discharge opening plate provided with discharge openings corresponding to the discharge energy transducing devices, and electrode pads arranged on the circumference of the chip. For this head, the inner leads of TAB tapes for use of electric power supply are connected with the electrode pads on the chip by use of a single point bonding tool having a groove structure formed by two grooves configured to intersect vertically at the tip thereof.

As described above, the method for manufacturing a liquid jet recording head is arranged to include a step of connecting the inner leads of the TAB tapes for use of electric power supply with the chip having the ink supply hole and discharge energy transducing devices for discharging ink on the central part of the chip by use of the single point bonder having the groove structure which is provided with two grooves configured to intersect vertically at the tip thereof. Therefore, it becomes unnecessary to enhance the adsorption to fix the chip on the chip stage when the inner leads of the TAB tapes are connected by means of ILB with the electrode pads on the chip of the liquid jet recording head. In this manner, the ILB can be carried out reliably even with a comparatively weak adsorption applied to the chip fixation. As a result, there is no fear that dust particles or the like adhere to the upper surface of the discharge energy transducing devices on the chip. It also becomes possible to obtain a reliable electrical connection appropriately and in good precision, and good quality liquid jet recording head at lower costs as well.

DETAILED DESCRIPTION OF THE PREFERRED EMBODIMENTS

Hereinafter, with reference to the accompanying drawings, the description will be made of the embodiments in accordance with the present invention.

Figure 1A:
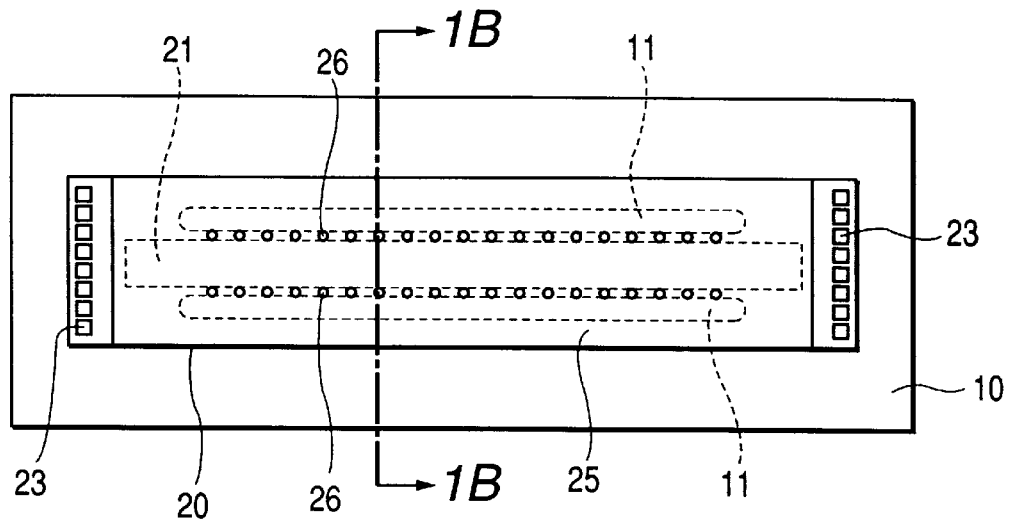
FIG. 1A is a plan view which schematically shows the state where the chip, which is used for the liquid jet recording head having the ink supply opening formed on the central part thereof, is fixed by means of adsorption on the chip stage of the ILB bonder in accordance with the present invention.
Figure 1B:
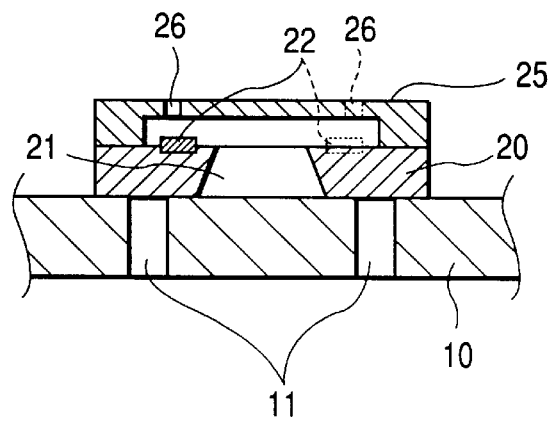
FIG. 1B is a cross-sectional view taken along line 1B—1B in FIG. 1A.
Figure 1C:
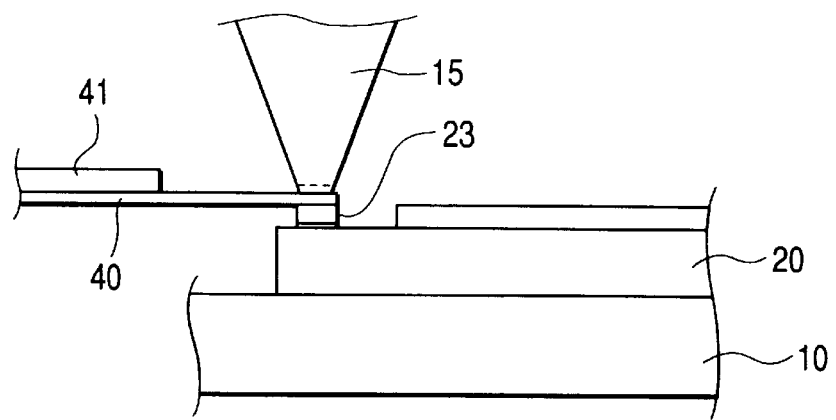
FIG. 1C is a schematic view which shows the mode in which the TAB inner lead is connected with an electrode pad on the chip used for the liquid jet recording head.

FIG. 1A is a plan view which schematically shows the state where the chip, which is used for the liquid jet recording head having the ink supply opening formed on the central part thereof, is fixed by means of adsorption on the chip stage of the ILB bonder. FIG. 1B is a cross-sectional view taken along line 1B—1B in FIG. 1A. FIG. 1C is a schematic view which shows the mode in which the TAB inner lead is connected with an electrode pad on the chip used for the liquid jet recording head.

In FIGS. 1A to 1C, a chip 20 is the chip used for a liquid jet recording head. On the central part thereof, there is provided an ink supply opening 21 which is penetrated through the chip from its reverse side for the arrangement of ink supply. On both sides of the ink supply opening 21, a plurality of heat generating resistors 22, which serve as discharge energy transducing devices, are arranged to face each other. On the surface of the chip, there are also arranged the nozzle unit (ink flow paths) formed to surround each of the heat generating resistors, and the discharge opening plate 25 provided with a plurality of discharge openings 26 formed on the corresponding heat generating resistors 22. The external dimension of the chip is 3.05 mm×14.00 mm. The ink supply opening 21 is formed in a size of 0.88 mm×11.87 mm. Then, on the circumference of the chip 20, a plurality of electrode pads are formed in order to apply driving signals to each of the heat generating resistors 22. On each of the electrode pads, the ball bumps or some other bumps 23, 23, . . . are arranged, respectively.

The chip stage 10 of the ILB bonder, which fixes the chip 20 by means of adsorption and heats it, is provided with the adsorption holes 11 and 11 which are elongated in a width of 0.4 mm and arranged at pitches of 1.6 mm. The adsorption holes 11 and 11 are connected with a vacuum pump or some other evacuating source (not shown). Above the chip stage 10 that fixes the chip 20 by means of adsorption and heats the bumps 23 on the chip, a bonding tool 15 (see FIG. 1C) is arranged. To the bonding tool 15, ultrasonic waves are transmitted from the hone. Here, the structure is arranged so that the ultrasonic waves oscillates the tool. A load is given to the bonding tool 15, while being oscillated by means of the ultrasonic waves thus transmitted, when it is placed on the inner lead 40 of the TAB tape 41 which is positioned with the bump 23 on the chip 20 adsorbed and heated by the chip stage 10, hence pressing the TAB inner lead 40 and bump 23 to join the TAB inner lead to the bump. This operation is repeated per bump so that the TAB assembling is carried out for all the electrodes on the chip 20.

Now, the present invention is characterized in that the single point bonding tool 15, which is adopted for the ILB bonder, is provided with the groove type tip. Particularly, the tip of the bonding tool is configured so that the two grooves intersect each other vertically. With such bonding tool whose tip is provided with the two grooves that vertically intersect, it becomes unnecessary to enhance the capability of adsorption for the intended fixation of the chip 20 on the chip stage 10 of the ILB bonder. The bump 23 on the chip and the TAB inner lead 40 can be joined appropriately in good precision for a reliable electrical connection between them even by the ILB to be executed with the fixation obtainable by a comparatively weak adsorption. As a result, even with the ILB in an ordinary room, there is no fear that dust particles or the like adheres to the upper surface of the heat generating resistors 22. There is no need for any provision of expensive facilities such as a clean booth or a clean room. In this way, good quality recording heads can be obtained at lower costs. Furthermore, it becomes possible to avoid the mood that affects the reliability of packaged product, such as the peeling off occurring between the bumps and inner leads or silicon being cracked underneath the pads when pulling tests are carried out for the inner leads after the ILB assembling, hence affecting the reliability of the packaged products.

(Embodiments)

Now, the present invention will be described further in detail in accordance with specific embodiments thereof. However, it is to be understood that the scope of the invention is not limited to the embodiments given below.

(Embodiment 1)

When executing the ILB, the chip 20 used for the liquid jet recording head is placed on the chip stage 10 of the ILB bonder installed in an ordinary room as shown in FIG. 1C, and adsorbed through the adsorption holes 11 and 11 of the chip stage 10. At this juncture, the chip adsorption is set at 38662.8 Pa (−470 mmHg) measured by the vacuum gauge installed between the adsorption hole 11 and the evacuating source in condition that the surface temperature of the chip 20 is adjusted to 150° C. Then, the bump 23 on the electrode pad of the chip 20 is connected by use of the bonding tool 15 with the inner lead 40 having the lead width of 60 $\mu$m, which is gold plated in a thickness of 1 $\mu$m or more on a rolled copper of 23 $\mu$m. As the bonding tool 15, the so-called groove type 1183 (kayser tool) is used. This tool has a groove structure where two grooves are formed at its tip to vertically intersect each other. In this case, the bonding tool 15 is installed so as to set the grooves at its tip at an angle of 45 degrees to one side of the inner lead 40 in the longitudinal direction thereof (see FIG. 2). Also, the bonding condition is: the bonding load is 110 g; the ultrasonic power is 260 mW; and the oscillating period of the ultrasonic waves is 15 ms.

Figure 2:
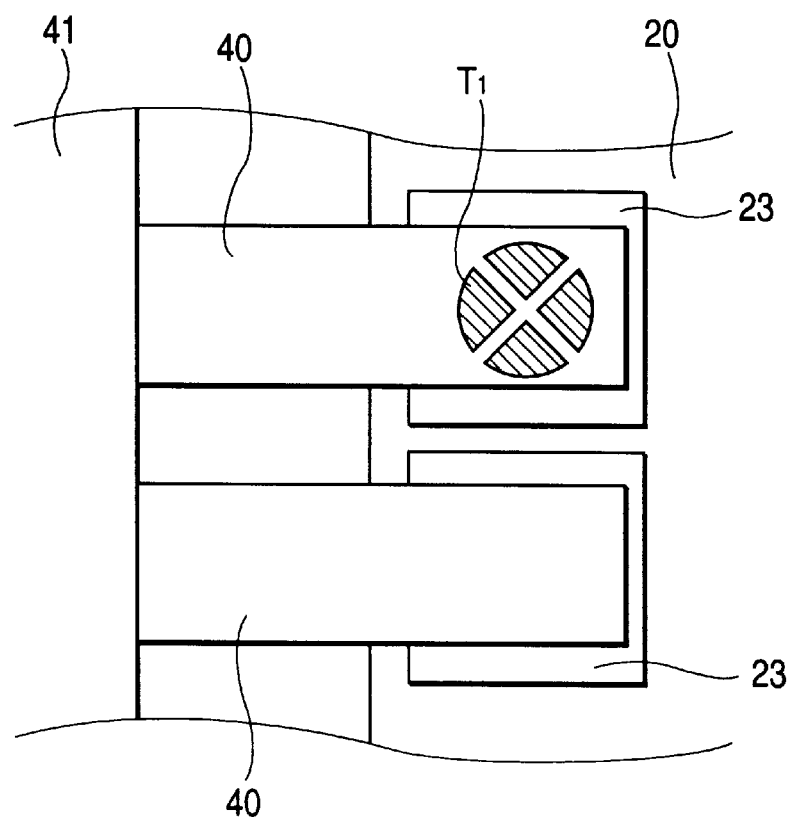
FIG. 2 is a plan view which shows the state where an inner lead is bonded to a chip bump by means of the ILB that uses a bonding tool having two grooves formed to vertically intersect at its tip in accordance with one embodiment of the present invention.

FIG. 2 shows the state that the ILB is completed for one bump 23. The inner lead 40 of the TAB tape 41 is connected with the bump 23 on the electrode pad of the chip 20 by means of the ultrasonic oscillation, pressure, and heating provided by the bonding tool 15. On the inner lead 40, the tool impression Ti remains corresponding to the tip configuration of the bonding tool 15.

After the ILB is carried out per bump in this way, the inner lead pulling test is carried out for 84 leads. As a result, the destructive mode is confirmed (that is, a destructive mode whereby the reliability is obtainable as a package) where all the inner leads are cut completely. Here, the minimum value of the pulling strength is 23.70 g, and the average value thereof is 29.6 g.

Further, after the ILB, each upper surface of the heat generating resistors on the chip is observed. It is then confirmed that there is no adhesion of dust particles or the like to the upper surface thereof at all. Thus, after sealing the inner lead portion, the chip is assembled into the recording head mode. With the head prepared in this manner, prints are made all in good condition.

(Embodiment 2)

Figure 3:
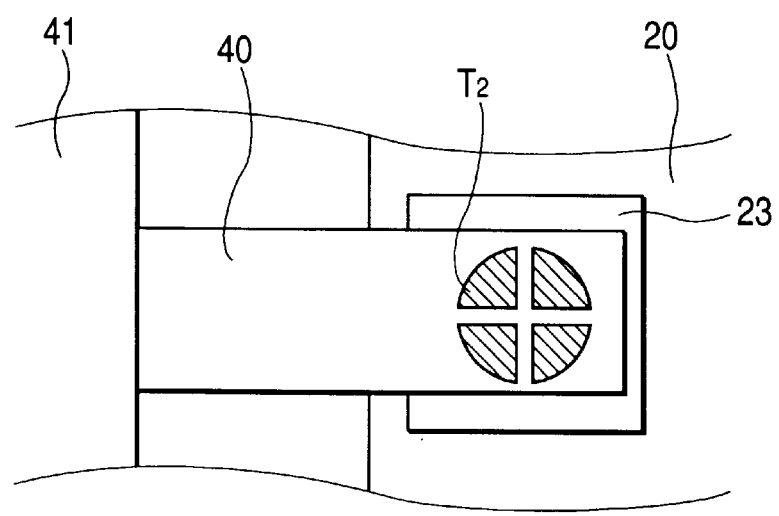
FIG. 3 is a plan view which shows the state where an inner lead is bonded to a chip bump by means of the ILB that uses a bonding tool having two grooves formed to vertically intersect at its tip in accordance with the other embodiment of the present invention.

In accordance with a second embodiment of the present invention, the tip grooves of the bonding tool 15 are directed vertically and horizontally (90° or 0°) with respect to one side of the inner lead in the longitudinal direction thereof. Only in this aspect, the second embodiment differs from the first embodiment. The ILB is carried out in the same conditions as those of the first embodiment with the exception of this aspect. FIG. 3 shows the state that the ILB is completed, in which the tool impression T2 remains on the inner lead 40 corresponding to the tip configuration of the bonding tool 30. Then, after the completion of the ILB, the pulling tests of the inner leads are carried out in the same manner as the first embodiment. As compared with the one bonded by means of the bonding tool whose tip grooves are directed at an angle of 45° to the inner lead (the first embodiment), those bonded in accordance with the second embodiment indicate a larger pulling strength of approximately 1.5 g as the average value thereof. Also, the same destructive mode is confirmed as in the first embodiment. There is no change in this respect.

COMPARATIVE EXAMPLE 1

Figure 4:
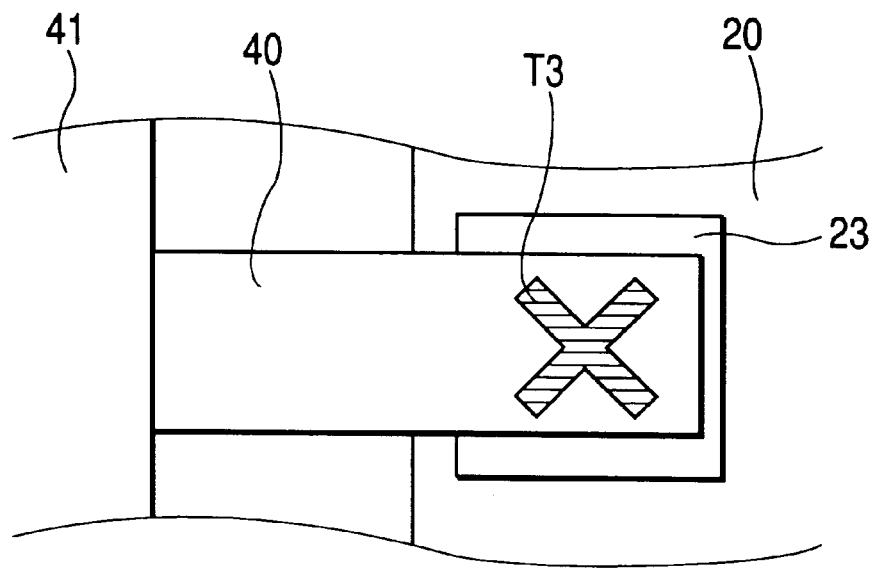
FIG. 4 is a plan view which shows the state where an inner lead is bonded to a chip bump by means of the ILB that adopts a bonding tool having two extrusions formed to vertically intersect at its tip, which is usually used in general.

Only the bonding tool is replaced with the one usually used in general, and the ILB is carried out in the same conditions as the first embodiment for comparison. In other words, as the bonding tool, the so-called extrusion type 1184 (kayser tool) is adopted. The bonding tool is provided with the cross-patterned extrusion at its tip. In this case, the bonding tool is installed so as to direct its extruded tip at an angle of 45° to the inner lead. FIG. 4 shows the state that the ILB is completed, in which the tool impression T3 remains on the inner lead 40 corresponding to the tip configuration of the bonding tool thus adopted.

After the completion of the ILB, the inner lead pulling tests are carried out for 56 leads. As a result, the mode in which pad silicon is cracked has taken place for three pads. For other pads, the destructive mode is such that the inner lead is normally cut. The average value of the pulling strength is 36.71 g, which is larger than that of the first embodiment. However, the minimum value is 16.91 g where the destructive mode has caused the pad silicon to be cracked.

COMPARATIVE EXAMPLE 2

Instead of the vacuum pump used for the first embodiment and the first comparative example, a vacuum pump that has a higher evacuating degree is adopted so as to make the chip adsorption as high as 5999.4 Pa (−715 mmHg). Then, the ILB is executed with all other conditions remaining the same as those of the first comparative example.

Figure 5:
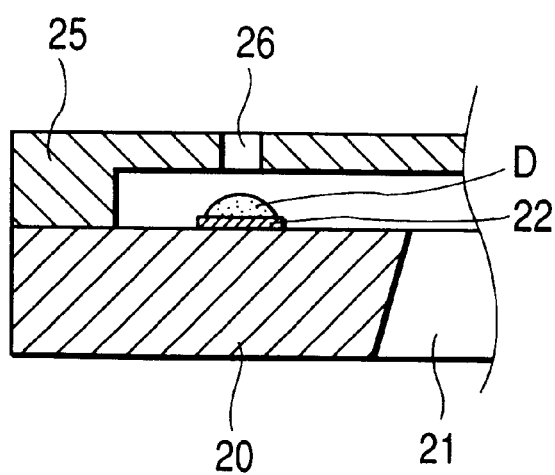
FIG. 5 is a cross-sectional view which shows the state where dust particles adhere to a heat generating resistor because of the air sucked through the discharge opening from the room in which the ILB bonder is installed.
Figure 6A:
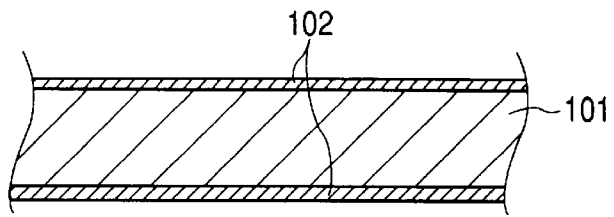
FIGS. 6A, 6B, 6C, 6D, 6E and 6F are views which illustrate one example of processing steps of the method for manufacturing a liquid jet recording head.
Figure 6B:
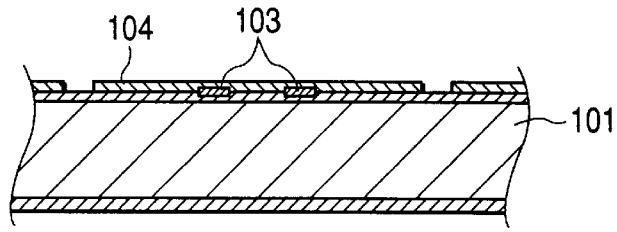
Figure 6C:
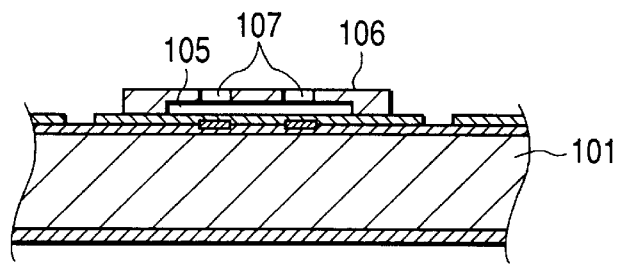
Figure 6D:
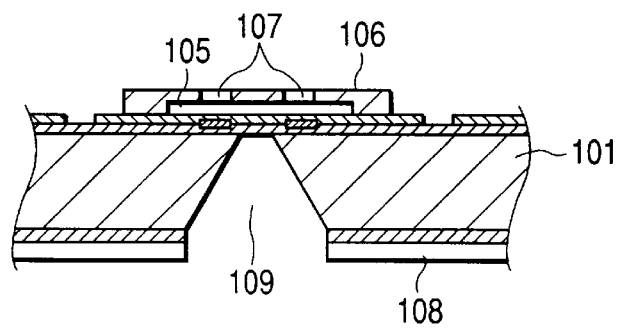
Figure 6E:
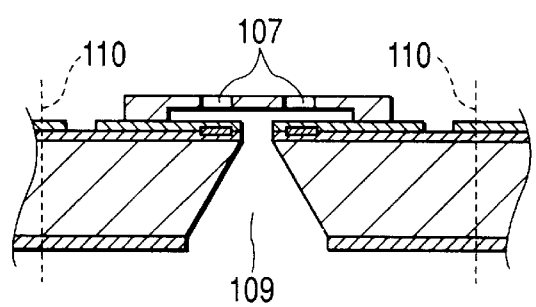
Figure 6F:
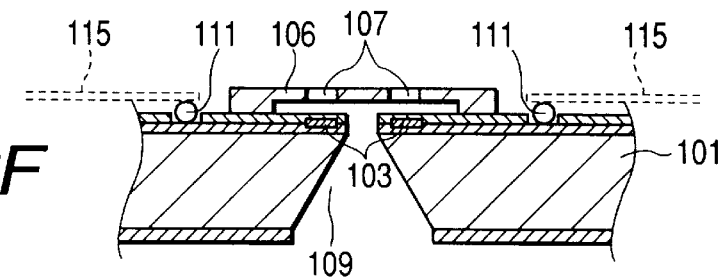

After the completion of the ILB, the upper surface of the heat generating resistors 22 of the chip 20 is observed. As a result, the adhesion of dust particles or the like D is found on the upper surface of the heat generating resistors 22. FIG. 5 shows such state. This is because the air in the room where the ILB bonder is installed is sucked into the adsorption holes 11 through the ink supply opening 21, thus allowing the dust particles or the like D in the air to adhere to the upper surface of the heat generating resistors 22.

The inner lead portion on the chip 20 is sealed subsequent to the completion of the ILB, and then, the chip is assembled into the recording head mode for printing. It is then found that ink discharges are instable, making it impossible to obtain good prints.

COMPARISON EXAMPLE 3

The ILB bonder is installed in a clean room. The ILB is executed with all the other conditions remaining the same as those of the second comparison example. After the completion of the ILB, the upper surface of the heat generating resistors on the chip is observed. It is then found that there is no adhesion of dust particles or the like to the upper surface of the heat generating resistors. Also, the inner lead portion of the chip is sealed subsequent to the completion of the ILB, and the chip is assembled into the recording head mode for printing. With the head thus prepared, good prints are obtained.

As clear from the first and second embodiments, the present invention makes it possible to connect the chip bumps and TAB inner leads appropriately in good precision, and obtain its electrical connection reliably by use of a single point bonding tool having a groove structure formed by two grooves vertically intersecting at its tip, that is, the single point bonding tool of cross-patterned groove type, even when the chip used for the liquid jet recording head has a hole formed on the central part of the chip, which hinders the chip fixation by means of adsorption with a sufficient strength thereof. Therefore, in accordance with the present invention, it is possible to obtain good quality recording heads at lower costs without the provision of any facilities, such as a clean booth or a clean room, and also, it is possible to improve the production yield of the heads.

In this respect, the present invention is particularly effective when applied to the recording head and the recording apparatus of the so-called ink jet recording type that records by forming flying droplets by the utilization of thermal energy, among those of liquid jet recording types.

Regarding the typical structure and operational principle of such method, it is preferable to adopt those which can be implemented using the fundamental principle disclosed in the specifications of U.S. Pat. Nos. 4,723,129 and 4,740,796, for example. This method is applicable to the so-called on-demand type recording system and a continuous type recording system as well.

To describe this method briefly. Discharge signals are supplied through the driving circuit to the electrothermal transducing devices serving as the discharge energy generating devices arranged for the sheet or liquid flow paths that retain recording liquid (ink). In other words, at least one driving signal, which provides a rapid temperature rise beyond a departure from nucleation boiling point in response to recording information, is applied in order to generate thermal energy so that film boiling is created on the thermoactive surface of the recording head. In this manner, the resultant formation of a bubble is made in the recording liquid (ink) one to one in response to each of the driving signals. Therefore, this method is particularly effective as a recording method of the on-demand type. By the development and contraction of the bubble, the liquid (ink) is discharged through a discharge opening to produce at least one droplet. The driving signal is more preferably in the form of pulses because the development and contraction of the bubble can be effectuated instantaneously and appropriately. The driving signal in the form of pulses is preferably such as disclosed in the specifications of U.S. Pat. Nos. 4,463,359 and 4,345,262. In this respect, the temperature increasing rate of the thermoactive surface is preferably such as disclosed in the specification of U.S. Pat. No. 4,313,124 for an excellent recording in a better condition.

The structure of the recording head may be as shown in each of the above-mentioned specifications wherein the structure is arranged to combine the discharging openings, liquid paths, and the electrothermal transducing devices (linear type liquid paths or right-angled liquid paths). Besides, the structure, such as disclosed in the specifications of U.S. Pat. Nos. 4,558,333 and 4,459,600 wherein the thermal activation openings are arranged in a curved area, is also effectively applicable to the present invention.

In addition, the present invention is effectively applicable to the structure disclosed in Japanese Patent Laid-Open Application No. 59-123670 wherein a common slit is used as the discharging openings for plural electrothermal transducing devices, and to the structure disclosed in Japanese Patent Laid-Open Application No. 59-138461 wherein an aperture for absorbing pressure wave of the thermal energy is formed corresponding to the discharge openings.

Further, the present invention is effectively applicable to a recording head of full-line type having a length corresponding to the maximum width of a recording medium recordable by the recording apparatus. For such recording head, it may be possible to adopt either a structure whereby to satisfy the required length by combining a plurality of recording heads or a structure arranged by one recording head integrally formed.

Moreover, the present invention is effectively applicable either to an exchangeable chip type recording head whose electrical connection with the apparatus main body and ink supply from the apparatus main body are enabled when the head is installed on the apparatus main body or to the recording head of cartridge type which is formed integrally with the recording head itself.

Also, for the present invention, it is preferable to additionally provide a recording head with recovery means and preliminarily auxiliary means as constituents of the recording apparatus because these additional means will contribute to making the effectiveness of the present invention more stabilized. To name them specifically, these are capping means, cleaning means, suction or compression means, preheating means such as electrothermal transducing devices or heating devices other than such transducing devices or the combination of those types of devices, and a predischarge means for performing discharge other than the regular discharge with respect to the recording head.

Further, as the recording mode of the recording apparatus, the present invention is not only applicable to a recording mode in which only one recording head is provided for use of one monochromic ink, but also, the present invention produces a significant effect on recording by an apparatus provided with at least one of various recording modes using a multiple color of different colors or a full-color of mixed colors, irrespective of whether the recording heads are integrally structured or structured by a combination of plural recording heads.

While describing the method so far, ink has been referred to as liquid. However, it may be an ink material which is solidified below the room temperature but soften or liquefied at the room temperature, or for the ink jet method, the ink may be such as to be soften or liquefied within the temperature not lower than 30° C. and not higher than 70° C. at which the temperature adjustment is made in general. In addition, while positively preventing the temperature rise due to the thermal energy by use of such energy as an energy to be consumed for changing states of ink from solid to liquid, or by use of the ink which will be solidified when left intact for the purpose of preventing the ink evaporation, it may be possible to adopt for the present invention the use of an ink having a nature of being liquefied only by the application of thermal energy, such as ink capable of being discharged as ink liquid by enabling itself to be liquefied anyway when the thermal energy is given in accordance with recording signals, and also, a kind of ink that will have already begun solidifying itself by the time it reaches a recording medium. In such a case, it may be possible to retain ink in the form of liquid or solid in the recesses or through holes of a porous sheet such as disclosed in Japanese Patent Laid-Open Application No. 54-56847 or 60-71260 in order to keep such ink to face the electrothermal transducing devices. In the present invention, the most effective method applicable to various kinds of ink mentioned above is the one capable of implementing the film boiling method as described above.

Moreover, as the mode of the recording apparatus of the present invention, it may be possible to adopt a copying apparatus combined with a reader or the like, in addition to the image output terminal for a computer or other information processing apparatus. Also, it may be possible to adopt a mode of a facsimile equipment having transmitting and receiving functions, among some others.

With the structure described above, the present invention makes it possible to achieve the electrical connection between bumps and inner leads in such a manner as to provide a mode in which inner leads are cut in the pulling tests after the completion of the ILB, that is, to achieve the electrical connection thus made that presents the destructive mode such as to confirm the reliability as a package, by use of a single point bonding tool having the groove structure formed to vertically intersect at its tip even when a chip cannot be fixed by means of adsorption sufficiently due to the ink supply hole formed on the central part thereof.

Then, there is no need for the provision of a higher adsorption in order to adsorb the chip for fixation. There is no fear that the dust particles or the like in the atmosphere is sucked into the chip to cause them to adhere to the heat generating resistors. As a result, it becomes unnecessary to provide any expensive facilities such as a clean booth or a clean room. Also, good quality recording heads can be obtained at lower costs.

Further, it is possible to enhance the pulling strength of inner leads by means of the ILB which is carried out by directing the grooves formed on the tip of the single point bonding tool horizontally and vertically in the longitudinal direction of the inner leads.

What is claimed is:

1. A method for manufacturing a liquid jet recording head comprising:

a step of connecting, by use of a single point bonder, a TAB tape for supplying electric power to a chip for a liquid jet recording head having on a central part thereof an ink supply hole and a discharge energy transducing device for discharging ink, wherein an inner lead of said TAB tape is connected to an electrode pad on said chip by use of a single point bonding tool having a groove structure formed by two grooves configured to intersect vertically at a tip thereof, and placing said chip, for said bonding, on a chip stage having a plurality of adsorption holes; and fixing said chip on said chip stage by applying to a portion of said chip a vacuum in an amount insufficient to cause almost any adhesion of particles to the discharge energy transducing device as a consequence of air being sucked through the liquid let recording head during the bonding because of the vacuum.

2. A method for manufacturing a liquid jet recording head according to claim 1, wherein the two grooves intersecting vertically at the tip of said single point bonding tool are arranged to be vertically and horizontally positioned, respectively, to one side of the objective inner lead in the longitudinal direction thereof.

3. A method for manufacturing a liquid jet recording head according to claim 1, wherein the two grooves intersecting vertically at the tip of said single point bonding tool are arranged to be at an angle of 45°, respectively, to one side of the objective inner lead in the longitudinal direction thereof.

4. A liquid jet recording head comprising a chip having an ink supply hole and a discharge energy transducing device for discharging ink formed on a central part of said chip, and a discharge opening plate provided with a discharge opening corresponding to said discharge energy transducing device, and an electrode pad arranged on a circumference of said chip, an inner lead of a TAB tape for use of electric power supply being connected with said electrode pad on said chip by use of a single point bonding tool having a groove structure formed by two grooves configured to intersect vertically at a tip thereof, the groove structure resulting in and producing a corresponding tool impression on said inner lead, the head having been prepared by placing said chip, for said bonding, on a chip stage having a plurality of adsorption holes, and fixing said chip on said chip stage by applying to a portion of said chip a vacuum in an amount insufficient to cause almost any adhesion of particles to the discharge energy transducing device as a consequence of air being sucked through the liquid jet recording head during the bonding because of the vacuum.

5. A liquid jet recording head according to claim 4, wherein said corresponding tool impression results from that the two grooves intersecting vertically at the tip of said single point bonding tool are arranged to be vertically and horizontally positioned, respectively, to one side of the objective inner lead in the longitudinal direction thereof.

6. A liquid jet recording head according to claim 4, wherein said corresponding tool impression results from that the two grooves intersecting vertically at the tip of said single point bonding tool are arranged to be at an angle of 45°, respectively, to one side of the objective inner lead in the longitudinal direction thereof.

* * * * *

UNITED STATES PATENT AND TRADEMARK OFFICE
CERTIFICATE OF CORRECTION

PATENT NO. : 6,126,271
DATED : October 3, 2000
INVENTOR(S) : Makoto Terui

It is certified that error appears in the above-identified patent and that said Letters Patent is hereby corrected as shown below:

COLUMN 1:
Line 39, "substrate" should read --substrate,---;

COLUMN 3:
Line 8, "are" should read --is--; and
Line 56, "are" should read --is-.

COLUMN 6:
Line 36, "mood" should read --circumstance--.

COLUMN 10:
Line 8, "soften" should read --softened--; and
Line 10, "soften" should read --softened--.

COLUMN 11:
Line 16, "let" should read --jet--.

Signed and Sealed this

Twelfth Day of June, 2001

*Attest:*

NICHOLAS P. GODICI
*Attesting Officer*  Acting Director of the United States Patent and Trademark Office